US008048813B2

(12) United States Patent
Lai et al.

(10) Patent No.: US 8,048,813 B2
(45) Date of Patent: Nov. 1, 2011

(54) METHOD OF REDUCING DELAMINATION IN THE FABRICATION OF SMALL-PITCH DEVICES

(75) Inventors: Chih-Yu Lai, Tainan (TW); Cheng-Ta Wu, Shueishang Township (TW); Neng-Kuo Chen, Sinshih Township (TW); Cheng-Yuan Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 142 days.

(21) Appl. No.: 12/326,099

(22) Filed: Dec. 1, 2008

(65) Prior Publication Data
US 2010/0136791 A1    Jun. 3, 2010

(51) Int. Cl.
*H01L 21/302* (2006.01)
(52) U.S. Cl. .......................... 438/736; 438/689; 438/725
(58) Field of Classification Search .................. 438/703, 438/689, 694, 725
See application file for complete search history.

(56) References Cited

U.S. PATENT DOCUMENTS

| | | | |
|---|---|---|---|
| 5,047,117 A * | 9/1991 | Roberts ......................... 438/424 |
| 6,706,571 B1 | 3/2004 | Yu et al. |
| 6,858,478 B2 | 2/2005 | Chau et al. |
| 7,190,050 B2 | 3/2007 | King et al. |
| 7,247,887 B2 | 7/2007 | King et al. |
| 7,265,008 B2 | 9/2007 | King et al. |
| 7,508,031 B2 | 3/2009 | Liu et al. |
| 7,528,465 B2 | 5/2009 | King et al. |
| 7,605,449 B2 | 10/2009 | Liu et al. |
| 7,611,980 B2 * | 11/2009 | Wells et al. .................... 438/597 |
| 7,795,149 B2 * | 9/2010 | Sandhu ......................... 438/694 |
| 2004/0253388 A1 * | 12/2004 | Kim ............................ 427/536 |
| 2005/0153490 A1 | 7/2005 | Yoon et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0161251 A1 * | 7/2007 | Tran et al. ..................... 438/725 |
| 2008/0290470 A1 | 11/2008 | King et al. |
| 2008/0296632 A1 | 12/2008 | Moroz et al. |
| 2009/0142926 A1 * | 6/2009 | Dai et al. ...................... 438/703 |
| 2009/0181477 A1 | 7/2009 | King et al. |

* cited by examiner

*Primary Examiner* — Thanh V Pham
*Assistant Examiner* — Caleb Henry
(74) *Attorney, Agent, or Firm* — Slater & Matsil, L.L.P.

(57) ABSTRACT

A method of forming an integrated circuit structure includes providing a substrate; forming a first hard mask layer over the substrate; forming a second hard mask layer over the first hard mask layer; patterning the second hard mask layer to form a hard mask; and, after the step of patterning the second hard mask layer, baking the substrate, the first hard mask layer, and the hard mask. After the step of baking, a spacer layer is formed, which includes a first portion on a top of the hard mask, and a second portion and a third portion on opposite sidewalls of the hard mask. The method further includes removing the first portion of the spacer layer; removing the hard mask; and using the second portion and the third portion of the spacer layer as masks to pattern the first hard mask layer.

19 Claims, 8 Drawing Sheets

METHOD OF REDUCING DELAMINATION IN THE FABRICATION OF SMALL-PITCH DEVICES

TECHNICAL FIELD

This invention relates generally to integrated circuits, and more particularly to the fabrication of integrated circuits having pitches below lithograph resolution limits.

BACKGROUND

The reduction in the scale of integrated circuits requires the reduction of lithograph resolution limits. Generally speaking, the minimum pitch of integrated circuits cannot be less than the lithograph resolution limit. However, there are exceptions. By adopting certain techniques, it is possible to reduce the pitch of integrated circuits below the lithograph resolution limit, although such techniques typically require more process steps.

FIGS. 1 through 3 illustrate cross-sectional views of intermediate stages in a conventional process for achieving a below-lithograph-limitation pitch. Referring to FIG. 1, silicon substrate 10 is provided, which will be etched to form patterns, such as fins, in subsequent process steps. The formation of the fins requires the help of the overlying layers that are used for lithography purposes. The overlying layers include a first ashing removable dielectric (ARD) 12, silicon oxynitride 14, a second ARD 16, silicon oxynitride 18, and photo resist 20. Photo resist 20 is patterned.

Referring to FIG. 2, the patterns of photo resist 20 are transferred to the underlying silicon oxynitride 18 and second ARD 16 by dry etching. Typically, silicon oxynitride 18 will have remaining portions left over second ARD 16. Next, as shown in FIG. 3, spacer layer 22 is formed using plasma enhanced chemical vapor deposition (PECVD). In technical generations with large pitches, for example, greater than about 50 nm, spacer layer 22 is relatively conformal. However, for integrated circuits formed using 50 nm technology and below, the method is no longer usable. The reason is that PECVD is sensitive to surface conditions. The resulting spacer layer 22 is thus highly non-conformal, and for below 50 nm technologies, such non-conformity becomes too significant. It was noted that the thickness of the cap portions of spacer layer 22 is significantly greater than the thickness of the sidewall portions of spacer layer 22 on the sidewalls of second ARD 16. In subsequent steps, second ARD 16 needs to be removed from between the sidewall portions of spacer layer 22. Therefore, the increased thickness of the cap portions of spacer layer 22 adversely affects the subsequent process steps.

On the other hand, deposition methods for forming conformal films, such as atomic layer deposition (ALD), cannot be used to solve the above-discussed problem. It has been found that when ALD is used to form spacer layer 22, second ARD 16 as shown in FIG. 2 peels off. New methods are thus needed to solve the above-discussed problems.

SUMMARY OF THE INVENTION

In accordance with one aspect of the present invention, a method of forming an integrated circuit structure includes providing a substrate; forming a first hard mask layer over the substrate; forming a second hard mask layer over the first hard mask layer; patterning the second hard mask layer to form a hard mask; and after the step of patterning the second hard mask layer, baking the substrate, the first hard mask layer, and the hard mask. After the step of baking, a spacer layer is formed, which includes a first portion on a top of the hard mask, and a second portion and a third portion on opposite sidewalls of the hard mask. The method further includes removing the first portion of the spacer layer; removing the hard mask, with the second portion and the third portion including remaining portions un-removed; and using the second portion and the third portion of the spacer layer as masks to pattern the first hard mask layer.

In accordance with another aspect of the present invention, a method of forming an integrated circuit structure includes providing a semiconductor substrate; forming a first hard mask layer over the semiconductor substrate; forming an oxide layer over the first hard mask layer; forming a second hard mask layer over the oxide layer; patterning the second hard mask layer to form a first hard mask and a second hard mask close to each other; after the step of patterning the second hard mask layer, baking the substrate, the first hard mask layer, the first hard mask, and the second hard mask at a first temperature; and after the step of baking, forming a spacer layer at a second temperature no lower than the first temperature. The spacer layer includes a first portion and a second portion on opposite sidewalls of the first hard mask, and a third portion and a fourth portion on opposite sidewalls of the second hard mask. The second portion and the third portion face each other and are spaced apart from each other. The method further includes removing the first hard mask from between the first portion and the second portion of the spacer layer, and simultaneously removing the second hard mask from between the third portion and the fourth portion of the spacer layer; and using the first portion, the second portion, the third portion, and the fourth portion of the spacer layer as masks to pattern the first hard mask layer.

In accordance with yet another aspect of the present invention, a method of forming integrated circuit structures includes providing a substrate; forming a first hard mask layer over the substrate; forming an adhesion layer over and adjoining the first hard mask layer; forming an oxide layer over and adjoining the adhesion layer, wherein the oxide layer has a lower atomic percentage of silicon than the adhesion layer; forming a second hard mask layer over the oxide layer; patterning the second hard mask layer to form a hard mask; forming a spacer layer, wherein the spacer layer includes a first portion and a second portion on opposite sidewalls of the hard mask; removing the hard mask from between the first portion and the second portion of the spacer layer; and using the first portion and the second portion of the spacer layer as masks to pattern the first hard mask layer.

By performing the embodiments of the present invention, the delamination problem is solved, and hence features with smaller pitches may be formed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming below-lithograph-limit patterns in integrated circuits is provided. The intermediate stages of manufacturing preferred embodiments of the present invention are illustrated. Variations of the preferred embodiments are then discussed. Throughout the various views and illustrative embodiments of the present invention, like reference numbers are used to designate like elements.

Figure 1:
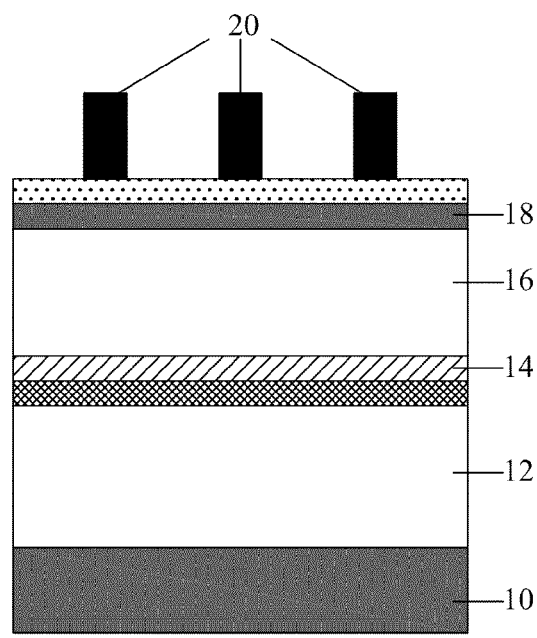
FIGS. 1 through 3 illustrate cross-sectional views of intermediate stages in a conventional process for achieving a below-lithograph-limitation pitch.
Figure 2:
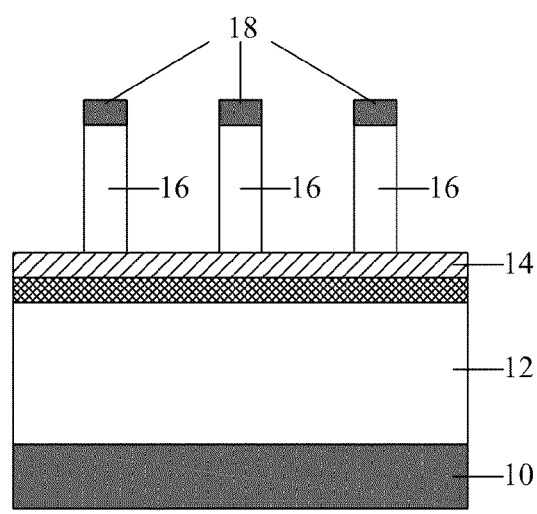
Figure 3:
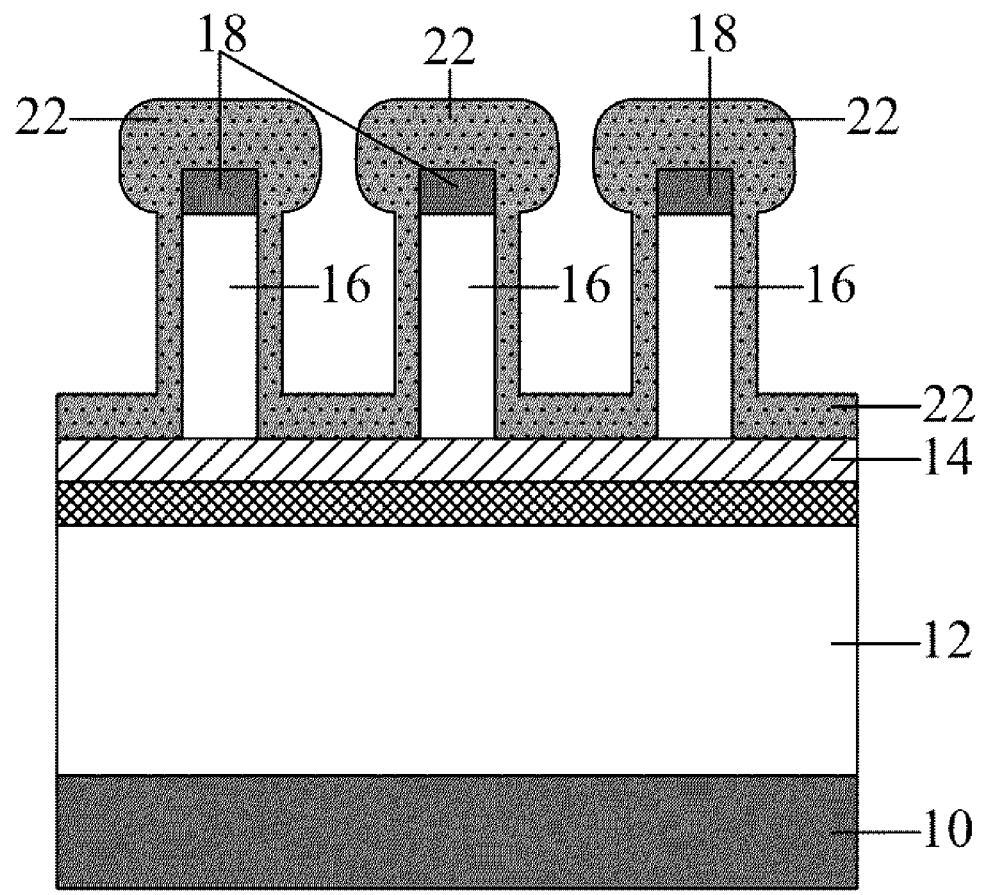
Figure 4:
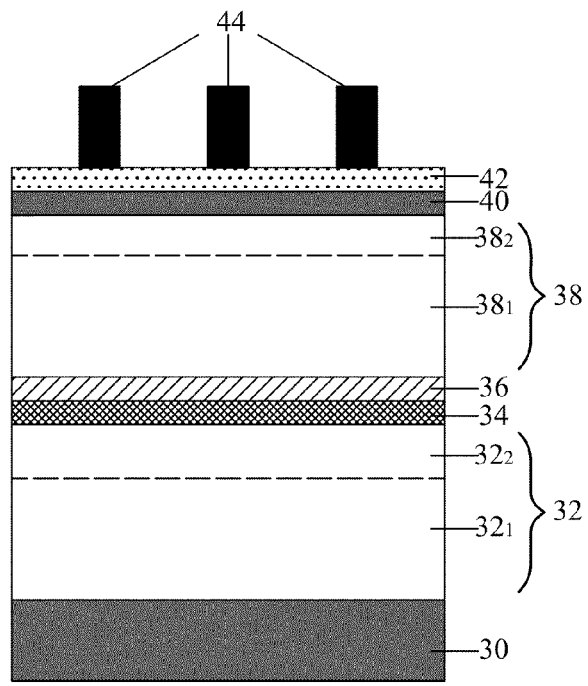
FIGS. 4 through 11 illustrate cross-sectional views of intermediate stages in the manufacturing of an embodiment of the present invention.

FIG. 4 illustrates a structure including substrate 30 and overlying layers. Substrate 30 may be formed of a commonly used semiconductor material such as silicon, silicon germanium, or the like, and may be a bulk substrate or a semiconductor-on-insulator (SOI) substrate. Hard mask 32 is formed over substrate 30. Preferably, hard mask 32 comprises an ashing removable dielectric (ARD) material, and hence is referred to as ARD 32 hereinafter, although it may also be formed of other materials. In an embodiment, ARD 32 includes light-absorption layer $32_1$ formed of, for example, amorphous silicon, and phase shift layer $32_2$, which has functions similar to that of an anti-reflective coating (ARC). Accordingly, phase shift layer $32_2$ is also sometimes referred to as dielectric ARC, or DARC. Advantageously, ARD 32 not only meets the selectivity requirement required for a hard mask layer, but also meets lithography-related requirements, such as the required reflectivity for the light used in the lithography steps. Further, ARD 32 can be removed by plasma ashing, and hence may be removed to form gaps having high aspect ratios.

Plasma enhanced (PE) oxide 34, which may be a silicon oxide formed using plasma enhanced chemical vapor deposition (PECVD), is formed over, and may adjoin, ARD 32. Silicon oxynitride layer 36 is formed over PE oxide 34. PE oxide 34 and silicon oxynitride layer 36 are both for lithographic purposes, for example, for reducing the reflection for the yellow light used in the exposure of the overlying photo resist. It is appreciated that layer 34 and/or layer 36 may also be formed of other materials.

ARD 38, silicon oxynitride layer 40, and bottom anti-reflective coating (BARC) 42 are formed over silicon oxynitride layer 36. ARD 38 may be formed of the same materials, and may possibly have the same structure, as ARD 32. Accordingly, ARD 38 may also include light absorption layer $38_1$, and phase shift layer $38_2$. One skilled in the art will realize that layers 38, 40, and 42 may be replaced by other materials and structures, and the number of layers may also be different from what is shown in FIG. 4. Photo resist 44 is formed over BARC 42 and patterned. Preferably, as will be discussed in detail in subsequent paragraphs, layers 38, 40, 42, and 44 are used to form patterns with small pitches, which may be less than the minimum pitch allowed by the lithography process used for forming the integrated circuits, and layers 32, 34, and 36 are used to transfer the small pitches to substrate 30.

Figure 5:
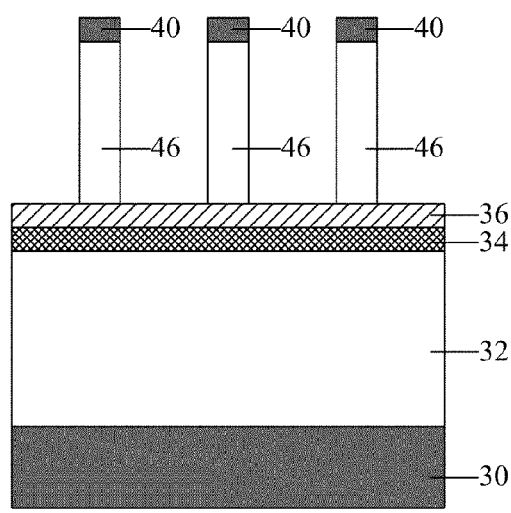

Next, BARC 42, silicon oxynitride layer 40, and ARD 38 are etched, for example, using plasma-assisted dry etching, followed by the removal of photo resist 44 and BARC 42. The resulting structure is shown in FIG. 5. ARD strips 46 are thus formed. In the resulting structure, leftovers of silicon oxynitride layer 40 are likely to remain on top of ARD strips 46.

Figure 6:
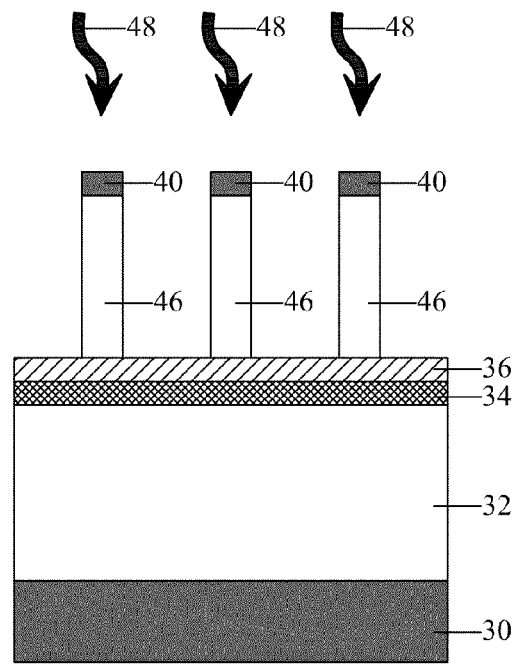
Figure 7:
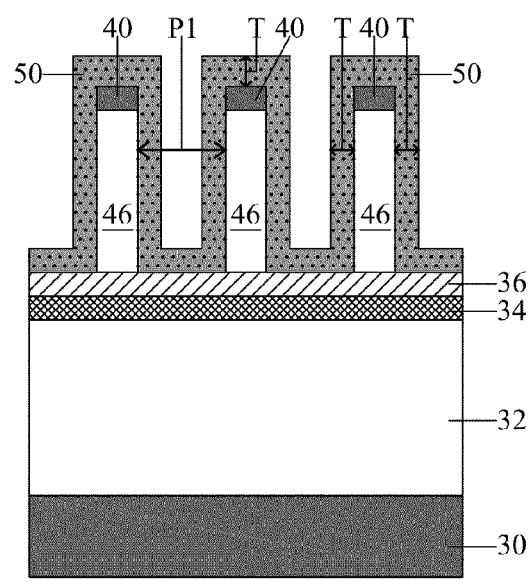

FIG. 6 illustrates the baking of the structure shown in FIG. 5, as is symbolized by arrows 48. The baking is performed when ARD 32 and silicon oxynitride layer 40 are not covered with additional layers, and are exposed. The baking temperature needs to be controlled carefully, in order to achieve the desired effect. The baking temperature is preferably not too low, so that ARD 32 may outgas at a desirable rate. On the other hand, the baking temperature is preferably not too high, so that the rate of outgassing from ARD 32 is not too high to cause an energy accumulation at the interface between ARD 32 and PE oxide 34, which energy accumulation may cause delamination of PE oxide 34 from ARD 32. With the controlled temperature, the outgas that would otherwise occur in the subsequent deposition of spacer layer 50 (refer to FIG. 7) occurs in the baking step in a controlled manner, and hence the energy that would otherwise accumulate rapidly in the subsequent deposition is released gradually. It is thus desirable that the temperature of the baking is either equal to, or slightly lower than (for example, by less than about 10° C.), the temperature adopted by the deposition step as shown in FIG. 7. In an exemplary embodiment, the baking temperature is between about 550° C. and about 900° C., and more preferably about 570° C. The baking duration may be about 1 hour. In the preferred embodiment, the baking is in-situ performed in the same chamber as the subsequent deposition step as shown in FIG. 7, although it may also be performed in a different chamber or in a furnace.

Next, as shown in FIG. 7, spacer layer 50 is deposited using a conformal deposition method. In the preferred embodiment, spacer layer 50 is deposited using atomic layer deposition (ALD), which may form a high quality film (with a low etching rate). The conformity may reach about 100 percent regardless of the surface condition. In an exemplary embodiment, the ALD is performed between about 560° C. and about 900° C. Such high temperatures are required for forming high-conformity films when the pitch P1 is less than about 50 nm. However, such high temperatures also cause the outgassing of ARD 32. Advantageously, with the baking step performed before the deposition of spacer layer 50, the likely delamination between ARD 32 and the overlying PE oxide 34 is eliminated due to the controlled outgassing and the gradual energy release. The ALD may be performed using dichlorosilane (DCS) and ammonia as precursors, and the resulting spacer layer 50 may include silicon-rich nitride. In alternative embodiments, other conformal deposition methods, such as low-pressure chemical vapor deposition (LPCVD), may be performed. In an exemplary embodiment, the temperature of the LPCVD is between about 560° C. and about 900° C., although it may also be lower, for example, as low as about 300° C. The thickness T of spacer layer 50 is preferably less than a half, and more preferably about a third, of pitch P1 of ARD strips 46.

Figure 8:
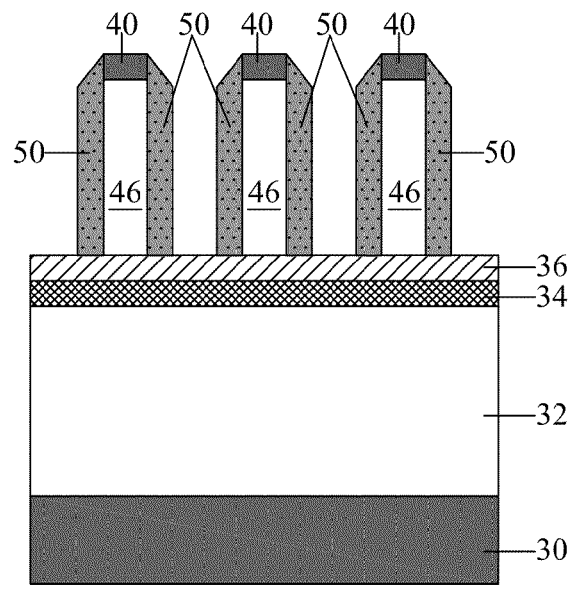

In FIG. 8, spacer layer 50 is etched, for example, using dry etching, so that portions of spacer layer 50 directly over silicon oxynitride layer 36 are removed, and hence silicon oxynitride layer 36 is exposed. In addition, the cap portions of spacer layer 50 are removed, at least partially.

Figure 9:
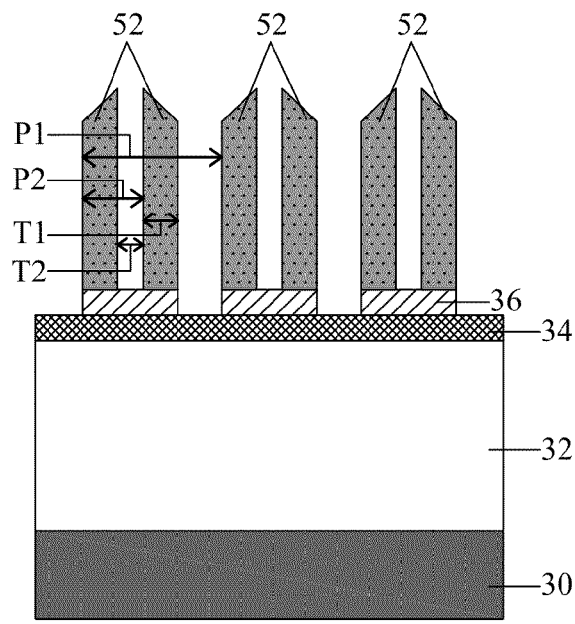

Next, the remaining portions of silicon oxynitride layer 40 are removed, for example, using dry etch. ARD strips 46 are then removed, for example, using plasma-assisted ashing. The resulting structure is shown in FIG. 9. The remaining portions of spacer layer 50 are used as masks for subsequent lithography processes, and are referred to as spacers 52. It is noted that the pitch P2 of spacers 52 is less than pitch P1. By adjusting the thickness T1 of spacer layers 50 and the thickness T2 of ARD strips 46, pitch P2 may be adjusted to about one-half of pitch P1. In the case pitch P1 (which is also the pitch between ARD strips 46) is already close to the minimum pitch allowed by the existing lithography technology, pitch P2 will be smaller than the minimum pitch.

Figure 10:
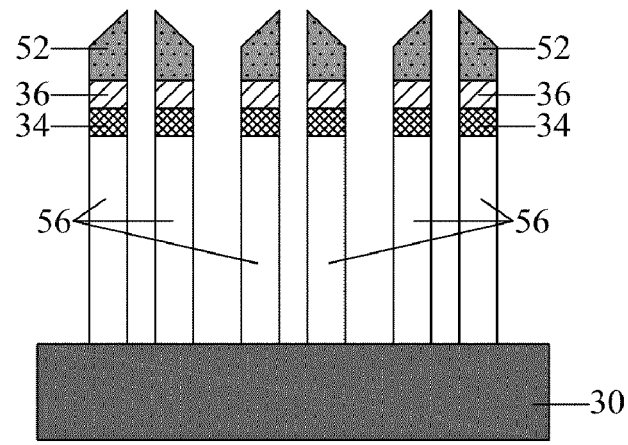
Figure 11:
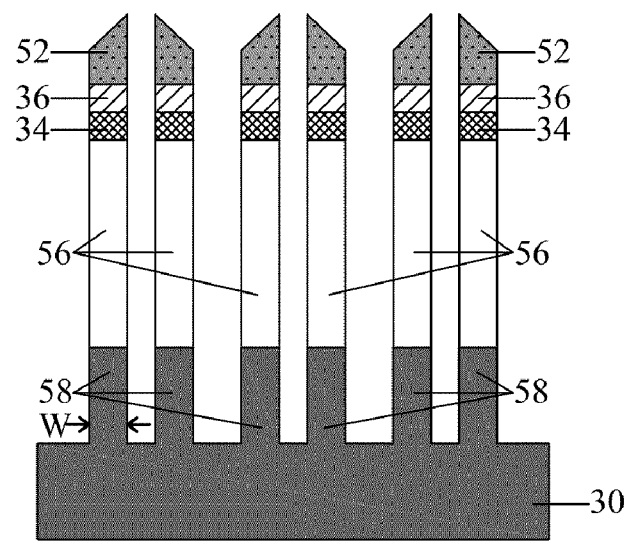

FIG. 10 illustrates the transfer of the pattern of spacers 52 to ARD 32, which involves various etching steps. ARD strips 56, which are remaining portions of ARD 32, are thus formed. Next, as shown in FIG. 11, ARD strips 56, and possibly the overlying remaining patterns of spacers 52 are used as hard masks for etching substrate 30. As a result, fins 58 are formed. Next, the remaining portions of ARD strips 56 are removed, for example, by ashing, and the overlying materials, if any remain at this stage, are removed, leaving fins 58. Advantageously, fins 58 have a pitch smaller than pitch P1 as shown in FIG. 7, which may be the minimum pitch allowed by lithography technology. Fins 58 may then be used to form FinFET transistors, for example, with a gate electrode of a FinFET (not shown) crossing more than one fin 58. Accordingly, with the increased channel width as a result of multiple small fins, the drive current of the resulting FinFET is increased.

Figure 12:
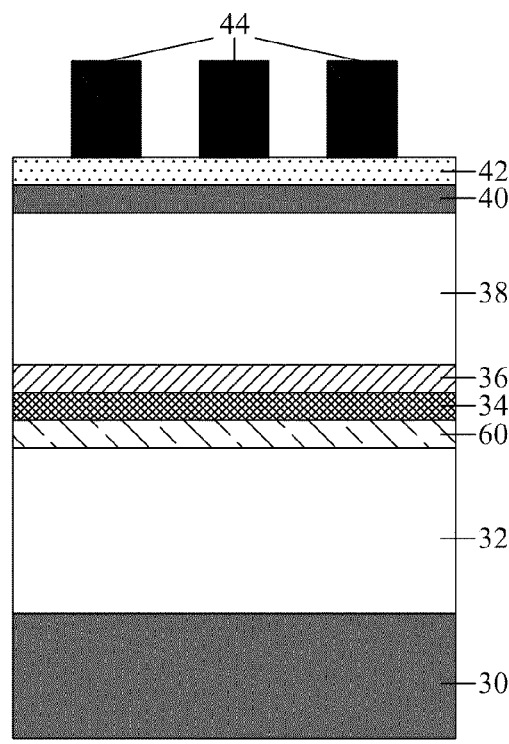
FIGS. 12 through 14 illustrate cross-sectional views of intermediate stages in the manufacturing of an alternative embodiment of the present invention.
Figure 13:
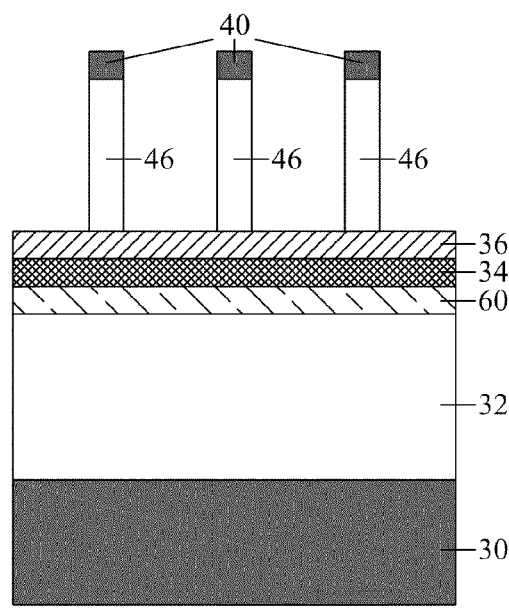
Figure 14:
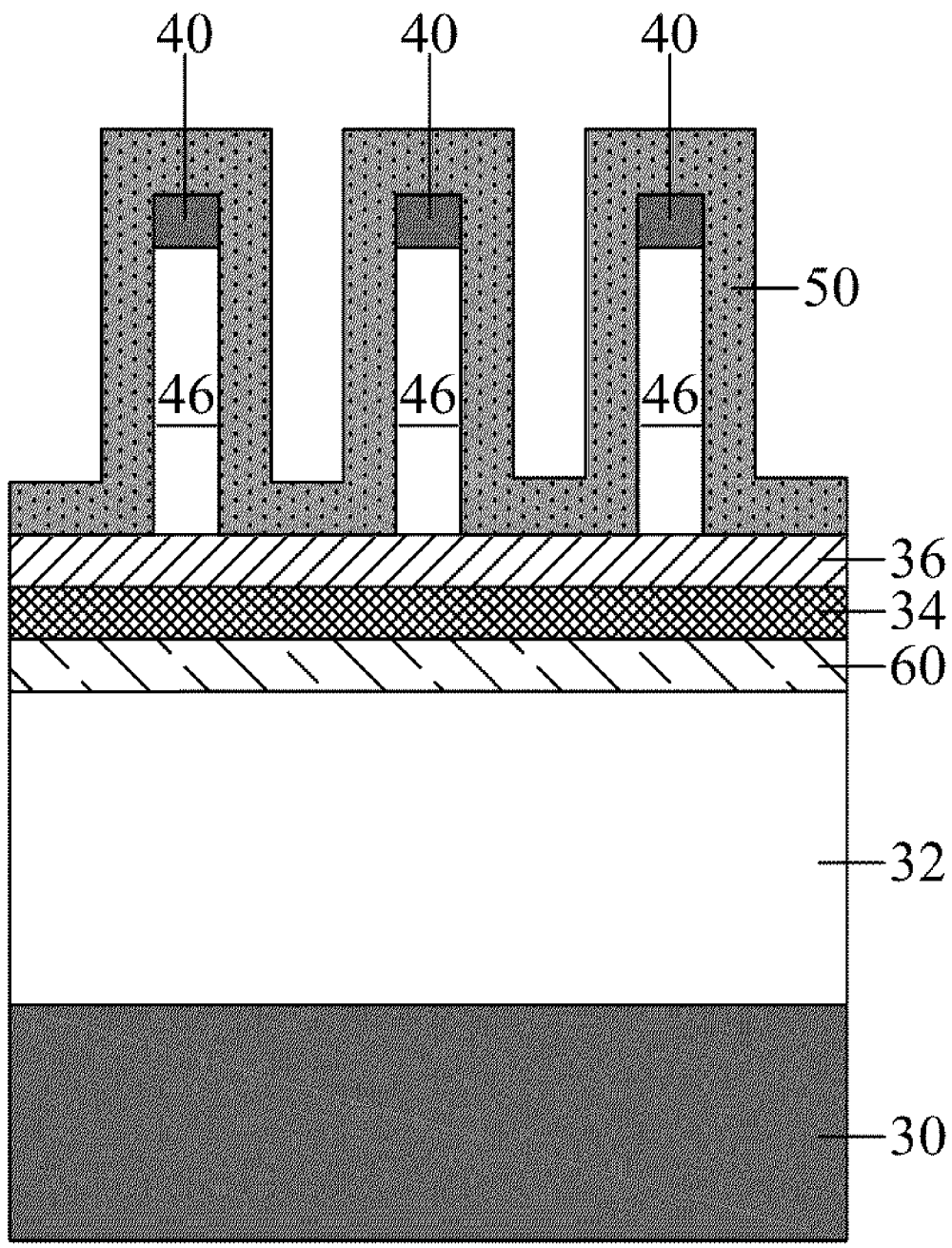

FIGS. 12 through 14 illustrate an alternative embodiment of the present invention. Referring to FIG. 12, an initial structure is provided. The initial structure is similar to the structure as shown in FIG. 4, except one or more adhesion layers 60 is inserted between ARD 32 and PE oxide 34. Adhesion layer 60 adjoins ARD 32. Experiments performed by the inventors of the present invention have revealed that PE oxide 34 and ARD 32 have a poor adhesion, and hence are prone to the delamination caused by the build-up energy, which is the result of the degassing from ARD 32. Adhesion layer 60 has a solid bonding with ARD 32, and also has a good adhesion with PE oxide 34. Therefore, the delamination that otherwise would occur between layers 32 and 34 is eliminated.

Adhesion layer 60 preferably has good light reflection and absorption properties suitable for the lithography process. In the preferred embodiment, adhesion layer 60 is formed of a silicon-rich material such as silicon oxynitride, silicon nitride, silicon-rich oxide, or combinations thereof, with the atomic percentage of silicon in the silicon-rich material being greater than the atomic percentage of silicon in layer 34, which may be silicon oxide. Adhesion layer 60 may also include multiple layers having good adhesion with both layers 32 and 34.

FIGS. 13 and 14 illustrate the subsequent process steps. FIG. 13 illustrates essentially a same step as shown in FIG. 5. In an embodiment, no baking is performed between the steps of patterning ARD 38 and forming spacer layer 50. In alternative embodiments, a baking is performed, which may be performed under essentially the same conditions as discussed in preceding paragraphs. In FIG. 14, spacer layer 50 is formed. Preferably, in the case adhesion layer 60 is formed instead of performing the baking, LPCVD is performed, which may be performed at a temperature between about 560° C. and about 900° C., although it may also be as low as about 300° C., or even lower. Alternatively, ALD may be performed using essentially the same conditions as discussed in the preceding embodiment. The subsequent process steps are essentially the same as shown in FIGS. 8 through 11, and hence are not repeated herein.

It is noted that although the embodiments discussed in the preceding paragraphs provide the formation process steps of semiconductor fins, the same method may also be used to form other small-pitch features other than semiconductor fins, wherein the small pitches may be smaller than the minimum pitch allowed by the respective lithography process.

In the embodiments of the present invention, the delamination occurring between ARD 32 and overlying materials is advantageously substantially eliminated. As a result, features with very small pitches and very small dimensions may be formed. For example, in the case the minimum pitch allowed by the respective lithography process is about 28 nm, the width W of fins 58 as shown in FIG. 11 may be as small as about 10 nm.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure, the method comprising:
   providing a substrate;
   forming a first hard mask layer over the substrate;
   forming a second hard mask layer over the first hard mask layer;
   patterning the second hard mask layer to form a hard mask;
   after the step of patterning the second hard mask layer, baking the substrate, the first hard mask layer, and the hard mask, wherein during the step of baking, the hard mask is not covered by any additional layer, and is exposed;
   after the step of baking, forming a spacer layer comprising a first portion on a top of the hard mask, and a second portion and a third portion on opposite sidewalls of the hard mask;
   removing the first portion of the spacer layer;
   removing the hard mask, with the second portion and the third portion of the spacer layer comprising remaining portions un-removed; and
   using the second portion and the third portion of the spacer layer as masks to pattern the first hard mask layer.

2. The method of claim 1, wherein after the step of patterning the first hard mask layer, remaining portions of the first hard mask layer comprise a first hard mask underlying the second portion of the spacer layer and a second hard mask underlying the third portion of the spacer layer, and wherein the method further comprises:
   etching the substrate using the first hard mask and the second hard mask to form a first fin underlying the first hard mask and a second fin underlying the second hard mask.

3. The method of claim 1, wherein a pitch between the second portion and the third portion of the spacer layer is less than a minimum pitch allowed by lithography processes used for patterning the first hard mask layer and the second hard mask layer.

4. The method of claim 1, wherein the step of forming the spacer layer is performed at a first temperature, and wherein the step of baking is performed at a second temperature lower than the first temperature.

5. The method of claim 4, wherein the second temperature is lower than the first temperature by less than about 10° C.

6. The method of claim 1, wherein the step of forming the spacer layer is performed using atomic layer deposition at a first temperature of greater than about 550° C., and wherein the step of baking is performed at a second temperature substantially equal to the first temperature.

7. The method of claim 1 further comprising:
   forming an oxide layer between the first hard mask layer and the second hard mask layer; and
   forming an adhesion layer between the oxide layer and the first hard mask layer, wherein the adhesion layer adjoins the first hard mask layer, and has a greater atomic percentage of silicon than the oxide layer.

8. The method of claim 1, wherein the spacer layer is formed using low-pressure chemical vapor deposition.

9. The method of claim 1, wherein the first hard mask layer and the second hard mask layer are formed of ashing removable dielectrics (ARDs).

10. A method of forming an integrated circuit structure, the method comprising:
    providing a semiconductor substrate;
    forming a first hard mask layer over the semiconductor substrate;
    forming an oxide layer over the first hard mask layer;
    forming a second hard mask layer over the oxide layer;
    patterning the second hard mask layer to form a first hard mask and a second hard mask close to each other;
    after the step of patterning the second hard mask layer, baking the semiconductor substrate, the first hard mask layer, the first hard mask, and the second hard mask at a first temperature, wherein the step of baking is performed without any additional feature covering the first and the second hard masks;
    after the step of baking, forming a spacer layer at a second temperature no lower than the first temperature, wherein the spacer layer comprises a first portion and a second portion on opposite sidewalls of the first hard mask, and a third portion and a fourth portion on opposite sidewalls of the second hard mask, and wherein the second portion and the third portion face each other and are spaced apart from each other;
    removing the first hard mask from between the first portion and the second portion of the spacer layer, and simultaneously removing the second hard mask from between the third portion and the fourth portion of the spacer layer; and
    using the first portion, the second portion, the third portion, and the fourth portion of the spacer layer as masks to pattern the first hard mask layer.

11. The method of claim 10, wherein the second temperature is substantially equal to the first temperature.

12. The method of claim 10, wherein each of the first hard mask layer and the second hard mask layer comprises a dielectric anti-reflective coating (ARC) over an amorphous silicon layer.

13. The method of claim 10 further comprising, after the step of patterning the first hard mask layer, etching the semiconductor substrate using remaining portions of the first hard mask layer as masks.

14. The method of claim 10, wherein the oxide layer comprises silicon oxide, and wherein the method further comprises:
    forming an adhesion layer between the oxide layer and the first hard mask layer, wherein the adhesion layer adjoins the first hard mask layer, and has a greater atomic percentage of silicon than the oxide layer.

15. The method of claim 10, wherein the step of forming the spacer layer is performed using a method selected from the group consisting essentially of atomic layer deposition and plasma enhanced chemical vapor deposition.

16. A method of forming an integrated circuit structure, the method comprising:
    providing a substrate;
    forming a first hard mask layer over the substrate;
    forming a second hard mask layer over the first hard mask layer;
    patterning the second hard mask layer to form a hard mask;
    after the step of patterning the second hard mask layer, baking the substrate, the first hard mask layer, and the hard mask;
    after the step of baking, forming a spacer layer comprising a first portion on a top of the hard mask, and a second portion and a third portion on opposite sidewalls of the hard mask, wherein the step of forming the spacer layer is performed using atomic layer deposition at a first temperature of greater than about 550° C., and wherein the step of baking is performed at a second temperature substantially equal to the first temperature;
    removing the first portion of the spacer layer;
    removing the hard mask, with the second portion and the third portion of the spacer layer comprising remaining portions un-removed; and
    using the second portion and the third portion of the spacer layer as masks to pattern the first hard mask layer.

17. The method of claim 16, wherein after the step of patterning the first hard mask layer, remaining portions of the first hard mask layer comprise a first hard mask underlying the second portion of the spacer layer and a second hard mask underlying the third portion of the spacer layer, and wherein the method further comprises:
    etching the substrate using the first hard mask and the second hard mask to form a first fin underlying the first hard mask and a second fin underlying the second hard mask.

18. The method of claim 1, wherein the step of baking is performed before any additional photo resist is formed over the hard mask.

19. The method of claim 10, wherein during the step of baking, the first and the second hard masks are exposed, with no additional features covering the first and the second hard masks.

* * * * *